United States Patent [19]

Engel et al.

[11] Patent Number: 5,457,714
[45] Date of Patent: Oct. 10, 1995

[54] SOFTWARE CONTROLLED ADAPTIVE DELTA MODULATOR

[75] Inventors: Melvyn Engel, Scottsdale; Michael D. Bethel; Michael J. Smith, both of Phoenix; Michael A. Sowell, Chandler, all of Ariz.

[73] Assignee: Wavephore, Inc., Tempe, Ariz.

[21] Appl. No.: 959,981

[22] Filed: Oct. 13, 1992

Related U.S. Application Data

[63] Continuation-in-part of Ser. No. 748,023, Aug. 21, 1991.

[51] Int. Cl.$^6$ ............................................. H04B 14/06
[52] U.S. Cl. ........................... 375/247; 375/248; 375/254; 341/143
[58] Field of Search .................. 375/27, 28, 29, 375/24; 341/143, 166

[56] References Cited

U.S. PATENT DOCUMENTS

| | | | |
|---|---|---|---|
| 3,652,957 | 3/1972 | Goodman | 375/30 X |
| 3,706,944 | 12/1972 | Tewksbury | 375/28 X |
| 3,723,909 | 3/1973 | Condon | 332/11 D |
| 3,839,675 | 10/1974 | Wernikoff et al. | 325/38 B |
| 4,371,972 | 2/1983 | Schwarz et al. | 375/7 X |
| 4,384,278 | 5/1983 | Benjamin | 340/347 |
| 4,411,002 | 10/1983 | Auger | 375/30 |
| 4,490,714 | 12/1984 | van de Plassche et al. | 340/347 |
| 4,501,001 | 2/1985 | Virupaksha et al. | 375/122 X |
| 4,507,791 | 3/1985 | Gundry | 375/27 |
| 4,633,196 | 12/1986 | Peled et al. | 332/11 D |
| 4,700,362 | 10/1987 | Todd et al. | 375/30 |
| 4,843,390 | 6/1989 | van Bavel et al. | 341/139 |
| 4,896,155 | 1/1990 | Craiglow | 341/120 |
| 4,903,023 | 2/1990 | Evans et al. | 341/120 |
| 4,920,544 | 4/1990 | Endo et al. | 375/26 |
| 5,021,786 | 6/1991 | Gerdes | 341/143 |
| 5,043,729 | 8/1991 | Fujimoto | 341/143 |
| 5,124,706 | 6/1992 | Gerdes | 341/156 |

FOREIGN PATENT DOCUMENTS

| | | |
|---|---|---|
| 3820174 | 12/1989 | Germany. |
| 8605048 | 8/1986 | WIPO. |

OTHER PUBLICATIONS

Tomasi, Wayne, *Electronic Communications Systems: Fundamentals Through Advanced*, Prentice Hall, Englewood Cliffs, New Jersey 1988 (pp. 650–655).
International Search Report for International Application No. PCT/US 92/01192 (date of mailing Sep. 21, 1992).
European Patent Office Search Report, European Application No. 91304417.8 (date of mailing Feb. 8, 1993).

*Primary Examiner*—Stephen Chin
*Assistant Examiner*—Bryan Webster
*Attorney, Agent, or Firm*—Spensley Horn Jubas & Lubitz

[57] ABSTRACT

A delta modulator automatically adjusting the slewing rate is disclosed. In the absence of a transition in the output data of a delta modulator, a parameter used for the integrator of the delta modulator is increased. When the comparator of the modulator indicates that the feedback signal of the modulator has overshot the input signal, the parameter is decreased or reversed until the two signals are approximately equal as signalled by a 50% duty cycle.

20 Claims, 8 Drawing Sheets

SOFTWARE CONTROLLED ADAPTIVE DELTA MODULATOR

This application is a continuation in part of U.S. patent application Ser. No. 07/748,023 filed on Aug. 21, 1991.

BACKGROUND OF THE INVENTION

1. Field of the Invention

This invention relates to using improved analog to digital and digital to analog conversion techniques for digital storage of data and more particularly to using such improved analog to digital and digital to analog conversion techniques using delta modulation.

2. Description of the Prior Art

During the last fifteen years, tremendous time, money and efforts have been devoted to translating analog signals into digital data. A wide variety of converters have been developed.

For example, analog to digital conversion can involve either a serial process or a parallel process. Serial conversion frequently allows for a simpler and a less costly implementation but tends to be slower than parallel conversion.

A further consideration is the amount of noise that is permitted. The more bits that are used for quantifying the analog signal, the less quantization noise that will result from the conversion and the greater the dynamic range of the system. For example, using simple pulse code modulation (PCM), 128 separate levels as represented by 7 bits are required for a dynamic of 42 dB while 131,072 separate levels or 17 bits is required for a dynamic range greater than 100 dB.

Figure 1:
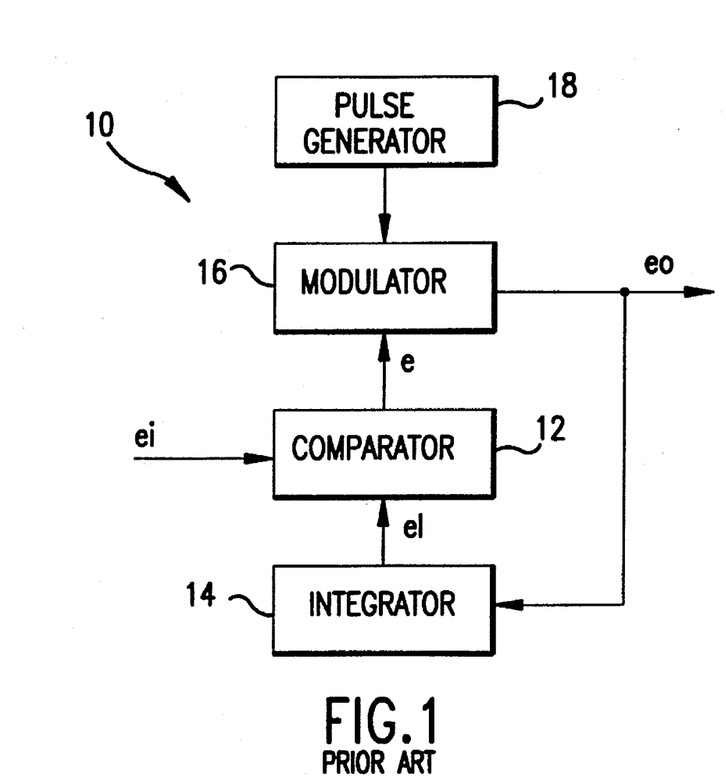
FIGS. 1 and 2 are block diagrams of a prior art delta modulator and demodulator.

One digital to analog system that may have relatively high dynamic range and low quantization noise is a delta modulation system, which is a one bit output form of a PCM system. FIG. 1 represents the classic delta modulation system 10. An input analog signal $e_i$ signal is fed through a comparator 12 with the output signal $\epsilon$ of the comparator 12 representing which of the input signal $e_i$ and a feedback output signal $e_1$ of an integrator 14 is greater. That output $\epsilon$ is modulated by a modulator 16 supplied with a periodic pulse train from a pulse generator 18. In effect, the modulator 16 samples the output $\epsilon$ of the comparator 12. The output of the modulator $e_o$ is fed back for integration by an integrator 14.

The result is that the output $e_o$ of the delta modulator 10 is a series of pulses. The pulses represent the rate of change of the signal amplitude from sampling instant to sampling instant.

Figure 2:
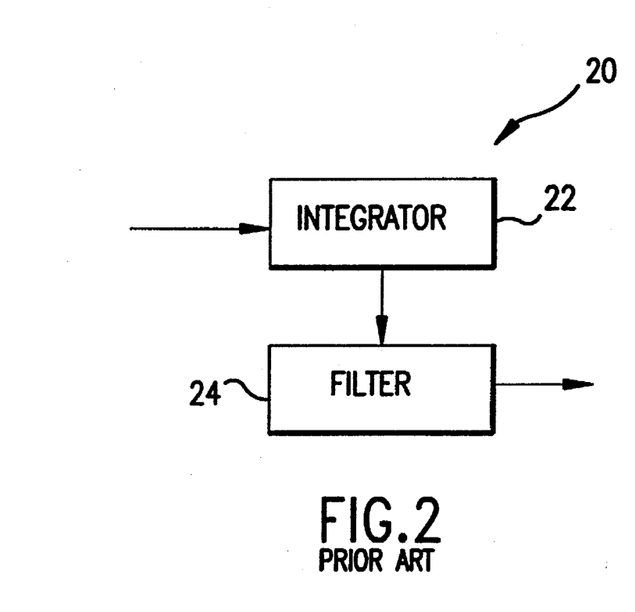

A system 20 to reconstruct the original input signal $e_i$ is shown in FIG. 2. The output $e_o$ of the delta modulator is integrated by an integrator 22 and is then inputted to a low pass filter 24 to eliminate high frequency noise caused by the sampling or the modulation. Alternatively, a frequency limited integrator may be used.

To reduce noise in the system, a higher frequency for the pulse train can be used. Further, instead of using just one integrator in the modulator and demodulator, two integrators may be used. Details regarding different types of delta modulators may be found in a variety of textbooks, including Philip F. Panther, *Modulation, Noise and Spectral Analysis* (1965).

However, delta modulators have several disadvantages. They are relatively slow in responding to rapid, large changes in the amplitude of the input signal. Further, delta modulators lose all D.C. information contained in the original analog signal. In addition, delta modulators have limited resolution.

Delta modulators also cause quantization noise in the resultant analog output signal upon conversion back to an analog signal. Commonly, such quantization noise can be avoided by dithering.

Another example of a delta modulator that overcomes some of these problems is shown in U.S. Pat. Nos. 5,021,786 and 5,124,706 to Gerdes and owned by the Assignee of the instant application. This patent describes an analog circuit that presets the delta modulator to compensate for overshoot and undershoot. This patent also includes a diode current steering bridge that controls the rate of charging or discharging the signal capacitor used in the delta modulator. The rate control circuit of this prior art patent provides a maximum rate of increase in the magnitude of the integrating current instantly for large changes in magnitude through the use of presets. That instant large current change is potentially undesirable. Further, the rate control circuit is an analog circuit and lacks the ready flexibility of a digital circuit.

Another problem with typical audio transmission systems is that typically the converted signals are grouped in some type of word or packetized coding. Common word coding schema include multi-bit PCM, Huffman coding or the like where a digital word is transmitted. Depending upon the coding technique used, the loss of even one bit in the word during transmission may cause the transmitted signal to lose intelligibility. For example, if speech is encoded with eight bit PCM using two's complement notation, the loss of the most significant bit in the word normally results in the data point being a positive number instead of a negative number. This can induce large scale audible errors at the receiver rendering the digitally transmitted audio signal unintelligible. Typically, it is believed that such word or packetized digital transmission systems have unintelligible speech measured against an articulation index at bit error rates of 0.0001; i.e., 1 error in 10,000.

Therefore, it is a first object of this invention to provide a relatively simple analog to digital converter that provides high speed conversion with good resolution. It is a further object of this invention to avoid the use of dithering to remove quantization noise and to avoid the loss of DC signals. And it is a still further object of this invention to provide such a converter that is simple and that may be incorporated into one integrated circuit. It is yet an another object to provide a system that will transmit intelligible voice information in an extremely noisy environment such as one that produces a bit error rate of 0.01.

SUMMARY OF THE INVENTION

These and other objects are achieved by improved analog to digital and digital to analog signal processors that use delta modulation. In particular, the disclosed invention uses circuitry that has a programmatically alterable slewing rate for an integrator.

When the analog input signal and the feedback signal of the delta modulator are approximately the same, the output data of the modulator toggles at a 50% duty cycle. As the difference between the signals increases, sequential output pulses remain fixed at a high or a low level. In the absence of a predetermined number of transitions in the output signal, the magnitude of the current used for the integrator starts to increase or decrease unless a maximum limit is attained. Until the feedback signal overshoots or undershoots the input signal, the magnitude of the current continues to increase. When the feedback signal overshoots or undershoots the analog input signal, the magnitude of the current is reduced and current flow reverses until the feedback signal overshoots or undershoots the input signal again. This process continually repeats until a 50% duty cycle in the output data is attained again.

When the output data is at a 50% duty cycle, the resolution of the modulator is at its finest. The current flow is controlled, however, so that the modulator will respond more quickly and the feedback signal will track the input signal more closely.

DETAILED DESCRIPTION OF THE PREFERRED EMBODIMENT

Figure 3:
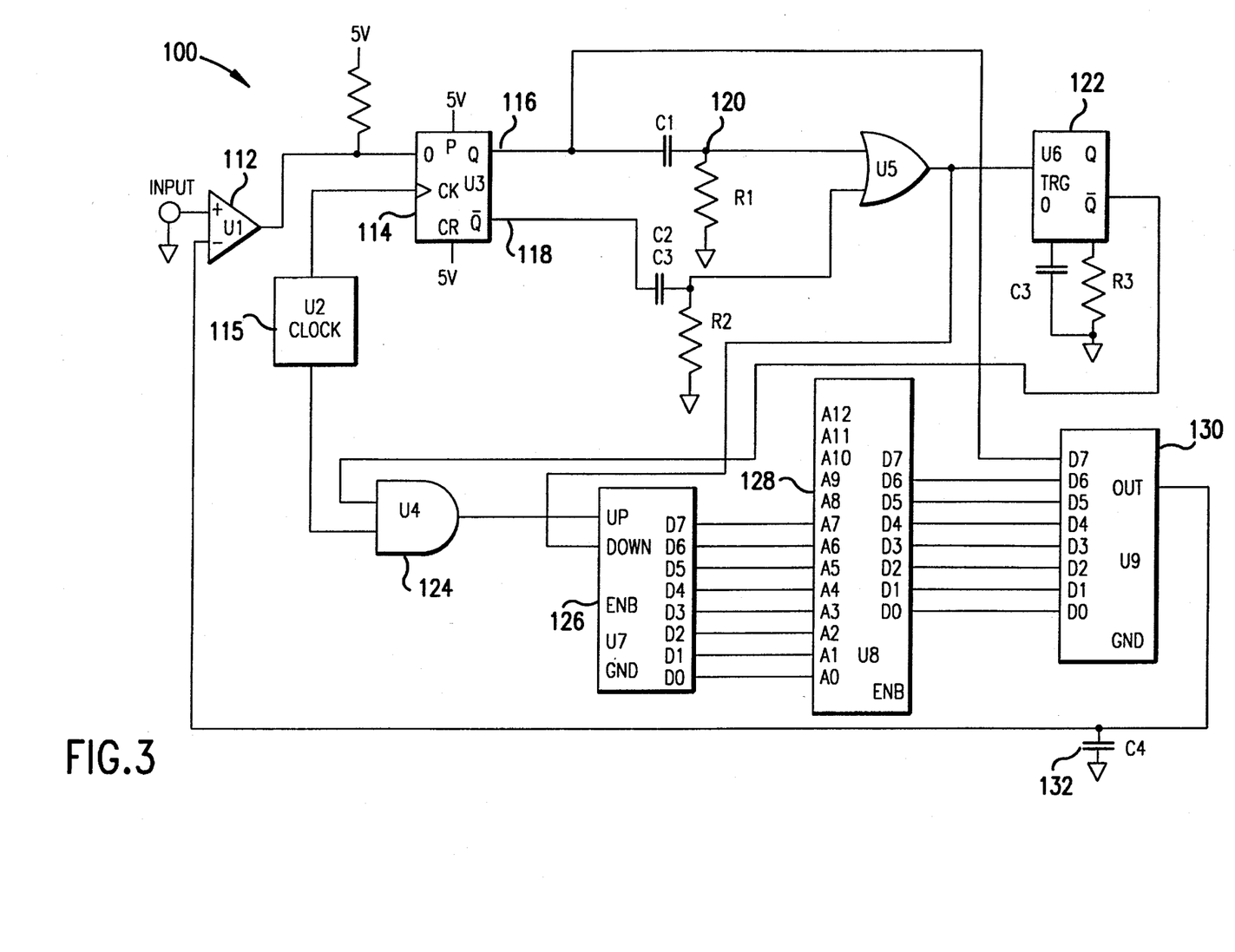
FIG. 3 is a schematic diagram of a delta modulator operating according to the disclosed invention for converting an analog input signal into a digital signal.

FIG. 3 shows a preferred embodiment 100 using the invention. An analog input signal is coupled to a non-inverting input of a comparator 112. The output of the comparator 112 is supplied to a D flip-flop 114 to sample the output of the comparator 112 on the falling edge of the clock signal. The clock signal is provided by a clock generator 115.

Both the normal and the inverted outputs of the flip flop 116 and 118 are provided to an edge detector 120. The output of the edge detector 120 is supplied to a timer 122 comprised of a multivibrator, The timer 122 provides an output signal whenever no edges or transitions in the logic levels in the signals 116 and 118 are detected within three cycles of the clock.

The output of the timer 122 gates the clock through AND gate 124 to provide the incrementing pulses to an up/down counter 126. The decrementing counting pulses are provided directly from the output of the edge detector 120. The counter 126 includes circuitry to prevent underflow or overflow of the counter 126.

The output of the counter 126 is the address to a Read Only Memory (ROM) 128. The ROM 128 acts as a memory look-up table for storing a transfer function that will be described in more detail later. The output data from the ROM 128 is converted into an analog charging current by a current digital to analog converter (DAC) 130.

The direction of the current flow from the DAC 130 is controlled by the normal output 116 of the flip-flop 114. The output 116 is coupled directly to the most significant bit (MSB) input of the digital to analog converter 130. Thus, when the normal output 116 of the D flip flop 114 is high, current flow from the DAC 130 is in a first direction while when the normal output is low, current flow is reversed.

The current from the DAC 130 is accumulated by an integrating capacitor 132 and is fed back as the feedback signal 134 to the inverting input of the comparator 112. The result of this circuit is a delta modulator having a digital output signal 116 with the modulator having an adjustable slew rate for the current integrator.

The adjustable slew rate allows the delta modulator 100 to more quickly respond to greater changes in the analog input signal while having a high degree of resolution for slowly changing signals. In particular, when the output data 116 lags behind changes in the analog input signal for longer time periods, the magnitude of the current supplied by the DAC 130 increases. The magnitude of the current continues to increase pursuant to the steps designated by the DAC 130 with each clock pulse until either a maximum limit is reached or the edge detector 120 provides a pulse indicating that the feedback signal 134 has overshot or undershot the analog input signal.

If the edge detector generates the pulse, the timer 122 is reset, the direction of current flow is reversed, the counter counts down one pulse and the current flow is decreased. If the feedback signal 134 overshoots or undershoots the input signal again, the magnitude of the input signal is reversed and the current flow is again decreased.

When the input signal is changing by less than the resolution of the converter, the output signal 116 typically has a duty cycle of approximately 50%. The direction of current flow reverses with each transition in the output signal 116. When the duty cycle of the output signal is at 50%, current flow is at a minimum and resolution is maximum.

The use of the ROM 128 allows for changing the transfer function between the counter 126 and the output current from the DAC 130. The data stored in the ROM represents a transfer function. For example, the transfer function may be linear with a positive slope, where the data stored in the ROM corresponds to the address. However, the transfer function may also be linear with a negative slope; the transfer function may also be non-linear, such as logarithmic or exponential. Using a nonlinear transfer function may provide for large current changes initially after the timer times out and the counter 122 is at a minimum count; subsequent increases in the current flow may be smaller. The data stored in the ROM may further compensate for non-linearities in the DAC 130. If only a linear transfer function is desired, however, the ROM 128 may be eliminated and the counter may be directly coupled to the DAC 130.

The transfer function may be selected by a user of the modulator 100 based upon the expected characteristics of the input signal such as the expected slew rate, the bandwidth of the signal, and the maximum and minimum limits of the signal. Thus, several different transfer functions may be stored in the ROM and the high order address bits may be used for selecting between different transfer functions. If the modulator 100 is contained within one integrated circuit, external pins on the integrated circuit may be used for selecting between transfer functions.

Switching between different transfer functions may be based upon logic or a microcontroller (not shown) that monitors the sequence of the output data 116. Thus, if the input level changes dramatically to be near a limit of the converter 100, the counter 122 may be at its maximum and a high current flow will result. To prevent a substantial undershoot or overshoot, the logic or the controller may change the transfer function temporarily.

Although the specific embodiment uses a multivibrator as a timer, a counter and a ROM for controlling a DAC and an integrating capacitor as an accumulator, other embodiments are also possible. In particular, an accumulator register may be positioned before a DAC and be substituted for the capacitor. In that case, the DAC 130 should preferably be a voltage DAC.

In addition, although a multivibrator is shown for detecting three sequential clock periods without a transition, other circuitry suitable for detecting such a data sequence may be used. In addition, the data sequence for incrementing the count may be two sequential clock periods without a transition in the signal 116, four clock periods or any other sequence of the output signal 116.

A further possible modification is to reset the count of the counter to prevent significant overshooting or undershooting by the feedback signal if the analog input signal stabilizes after a significant increase. When the feedback signal overshoots or undershoots with a relatively fast change in the magnitude of the input signal, the current from the DAC 130 may be at a maximum magnitude. Therefore, it may be desirable to decrease the current quickly to minimize ensuing overshoots or undershoots and to improve the resolution. Count monitoring circuitry (not shown) that can monitor the output of the edge detector 120 can look for a pulse after while the count value of the counter 126 is above a predetermined limit. The monitoring circuitry can reset the counter 126 to a smaller count to prevent an overshoot or an undershoot.

Figure 4:
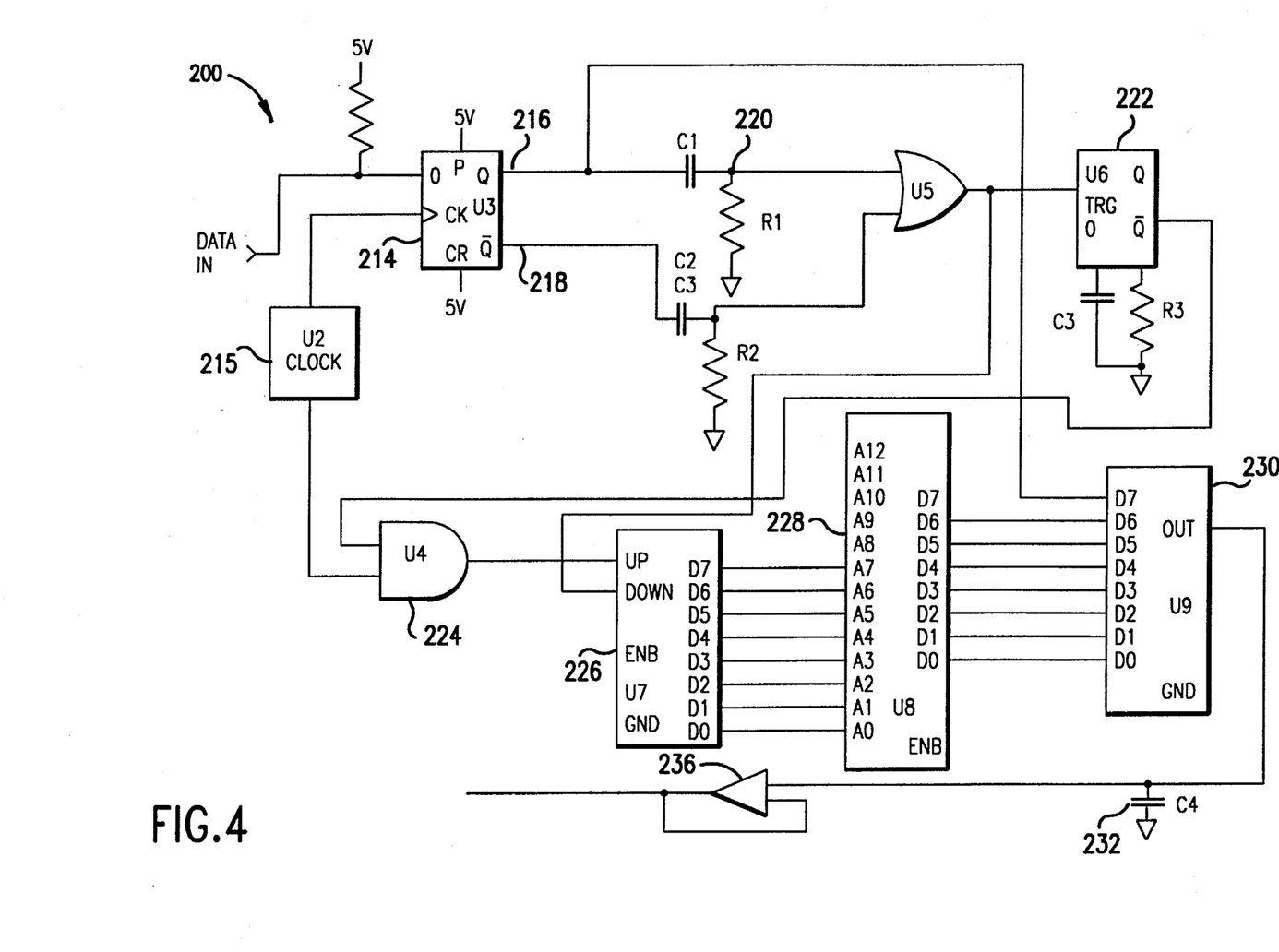
FIG. 4 is a schematic diagram of a converter for converting the output of the delta modulator of FIG. 2 back into an analog signal.

FIG. 4 shows a compatible digital to analog converter 200 with like parts bearing like numbers. The serial input data is synchronized to a local clock generator 215 by a D flip flop 214. The synchronized data 216 and the inverted synchronized data 218 are supplied to an edge detector 220, which in turn is coupled to a down counting input of a counter 226 and a timer 222 such as a multivibrator. The time out period for the timer 226 should be identical to the time out period of the timer 222 in the analog to digital converter 100.

The output of the clock generator 215 is gated by the output of the timer 222 through an AND gate 224 and provides the up counting pulses for the counter 226. The counter 226 again must have circuitry to prevent an underflow and overflow condition. The output of the counter 226 is coupled to the address lines of a ROM 228 that should preferably store the same transfer function or functions as the ROM 128 in the modulator 100.

The data output of the ROM 228 is supplied to a digital to analog current converter 230. The most significant bit of the converter is used for reversing current flow of the DAC 230 and is coupled to the output of the synchronizing flip flop 216. The output of the converter 230 is coupled to an integrating capacitor 232. A buffer amplifier 236 is coupled to the capacitor 232 and provides the output analog signal.

The digital to analog converter 200 of FIG. 4 may also be modified in a manner similar to how the analog to digital converter 100 of FIG. 3 may be modified. For example, multiple transfer functions may be stored in the ROM 228 and the selection between those functions may be controlled by logic monitoring the output sequence and the control logic; the timer 222 may be replaced with different circuitry or detect a different sequence, and in certain situations the ROM 228 may be eliminated entirely. Preferably the same modifications should be made to both the analog to digital converter 100 and the digital to analog converter 200 to reproduce at the output of the converter 200 an accurate facsimile of the analog input converter 100.

Figure 5:
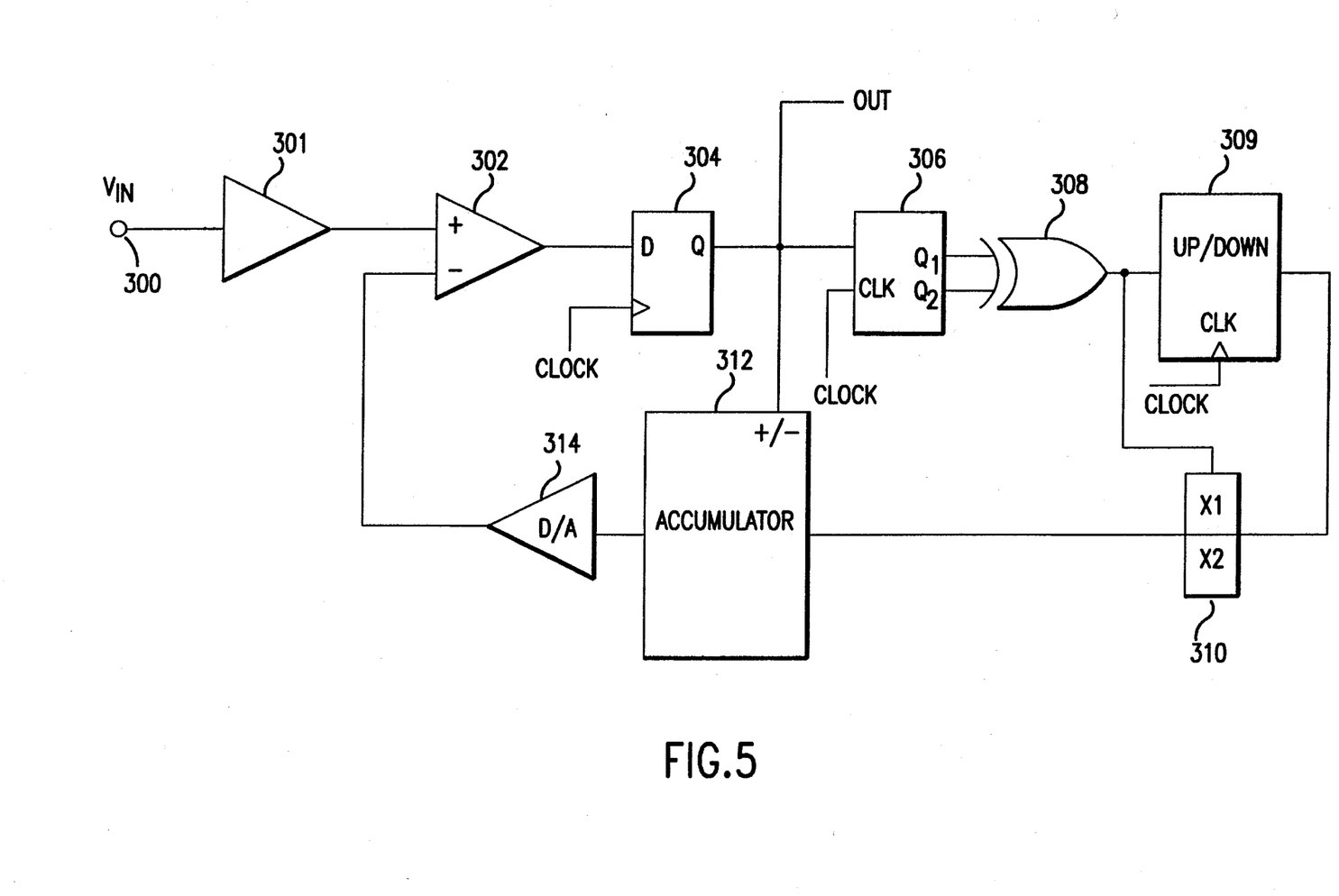
FIG. 5 is a schematic diagram of an alternative embodiment of a delta modulator according to the present invention.

Alternatively, the entire delta modulator and demodulator may be implemented using digital hardware with the inclusion of an analog comparator. In FIG. 5, a digital modulator is shown. The analog input 300 is supplied to the non-inverting input of a comparator 302. Preferably, for audio analog input signals, the signal has been processed for preemphasis of the higher frequency signals above five thousand hertz by a conditioning circuit 301. A feedback signal is supplied to the inverting input of the comparator 302.

The output of the comparator 302 is sampled in a latch 304 at an appropriate clock rate to supply the output signal. For high quality audio uses, the system clock may operate at one hundred ninety two kilohertz. It should be noted that synchronization connections of the system clock to most components for the purpose of clarity.

The output of the latch 304 is supplied to an edge detector comprised of an XOR gate 308 and a two bit shift register 306. Alternatively, the edge detector may comprise a two bit counter coupled to receive the pulses from the latch.

The output of the edge detector is coupled to an up/down counter 309 to control the direction of counting of the one hundred ninety two kilohertz system clock. The counter 309, which preferably has sixteen bits of resolution, counts up towards a maximum limit whenever the edge detector fails to detect a change between successive samples of the comparator 302 and counts down towards a minimum whenever the edge detector detects a change. The counter 309 includes overflow and underflow protection so that the count cannot exceed two hundred fifty five or decrease below zero.

The output of the counter 309 is supplied to a shift circuit 310 that operates in response to the edge detector 304. If an edge is detected, the sixteen bit output of the counter 308 is shifted left or multiplied by two by the shift circuit 310. Otherwise, the output of the counter remains unaffected or is "multiplied by one." In those cases of shifting where the most significant bit of the input to the shift circuit 310 is one, the output of the shift circuit 310 is set to $FF_{16}$.

The output of the shift circuit 310 is supplied to an integrating accumulator 312 that accumulates the data from the shift circuit 310. The integrating accumulator 312 preferably has at least sixteen bits resolution in two's complement arithmetic. The direction of accumulation (i.e., plus or minus) is controlled by the output of the latch. The accumulated value from the integrating accumulator 312 is supplied to a digital to analog voltage converter 314 to provide the feedback signal 315 for the inverted input to the comparator.

The output of the latch 304 provides the output of the modulator. The edge detector comprised of shift register 306 and XOR gate 308 causes the counter 309 to count the system clock pulses up if for any two or more successive bits, the output remain unchanged. Else, the counter 309 counts down.

One of two linear transfer functions is selected by shift circuit 310. When the counter 309 is counting up, the output of the counter is shifting left by one digit to multiply the data from the counter by two. However, when the counter 309 counts down, the transfer function selected is a linear slope of one. Alternatively, it should be understood that other types of transfer functions may be used such as linear transfer functions having different slopes by shifting the counter 309 output by a different number of bits. Alternatively a memory storing different transfer functions and means for selecting between different stored transfer functions as a result of the current output of the latch, the output of the edge detector or the output of some other circuitry responsive to the output of the latch may also be used. It may also be desirable to prevent the count value of the counter 309 from changing for the first system clock cycle when a change in the output state occurs after an output string in the same state for more than two successive samples.

The output of the shifter 310 is accumulated in the integrating accumulator 312. That output is added to the current value of the integrating accumulator 312 when the output state is high and is subtracted from the current value of the integrating accumulator 312 when the output is low. The output of the accumulator is supplied to the input of a digital to analog converter 314. The analog output of the inverter is coupled to the inverting input of the comparator 302 to complete the loop.

Hence the analog voltage from the digital to analog converter may be described according to equation 1

$$V_{out} \alpha \text{Accumulator}_t = \text{Accumulator}_{t-1} \pm (\text{Multiplier} * \text{Counter}) \quad (1)$$

Where $V_{out}$=the output of the digital to analog converter $\text{Accumulator}_t$ The current data stored in the accumulator $\text{Accumulator}_{t-1}$ The new data stored in the accumulator ± is controlled by the output of the latch where a true output for the latch results in addition and a false output for the latch results in subtraction Multiplier The amount of shifting of the output of the counter Counter The current contents of the counter α means proportional to It has been found that when certain input patterns occur, it is preferable to inhibit the counter for better reproduction of audio signals. Inhibit circuitry 320, which is responsive to the edge detector 306 and 308 may be used to inhibit multiplying the count of the counter 309 for one system clock period immediately upon the detection of an edge.

Figure 6:
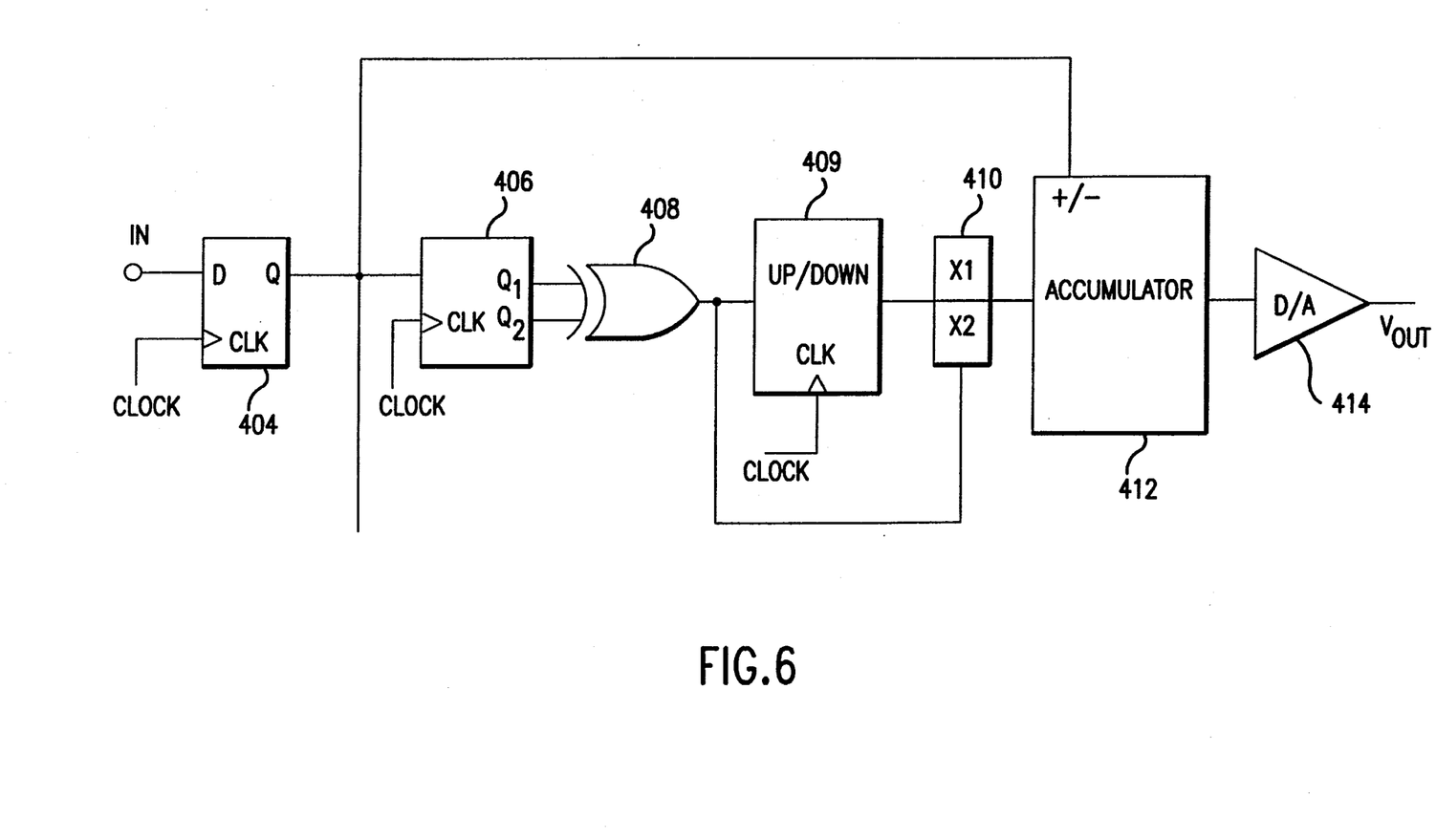
FIG. 6 is a schematic diagram of an alternative embodiment of a receiver compatible with the Delta modulator of FIG. 5.

The receiver or slave is shown in FIG. 6 for the transmitter with like components bearing like numbers. The receiver is comprised of a latch 404 an edge detector 406, a 16 bit counter 409 a shifter 410 an integrating accumulator 412 and a digital to analog converter 414. The receiver or slave also includes a system clock coupled to the latch, the counter, the accumulator and the digital to analog converter operating at the same frequency as the system clock in the transmitter or master of FIG. 3.

Due to the use of digital circuitry, further embellishments can be added. For example, a common problem with delta modulators is that DC offsets may be built up in the receiver. This can result with the analog output of the receiver reaching the full scale voltage of the circuit such as the full scale output of the converter 414. When such DC offsets build up near the full scale magnitude of the receiver, the receiver can no longer accurately track the original analog input signal and may "clip" the output signal.

Figure 7:
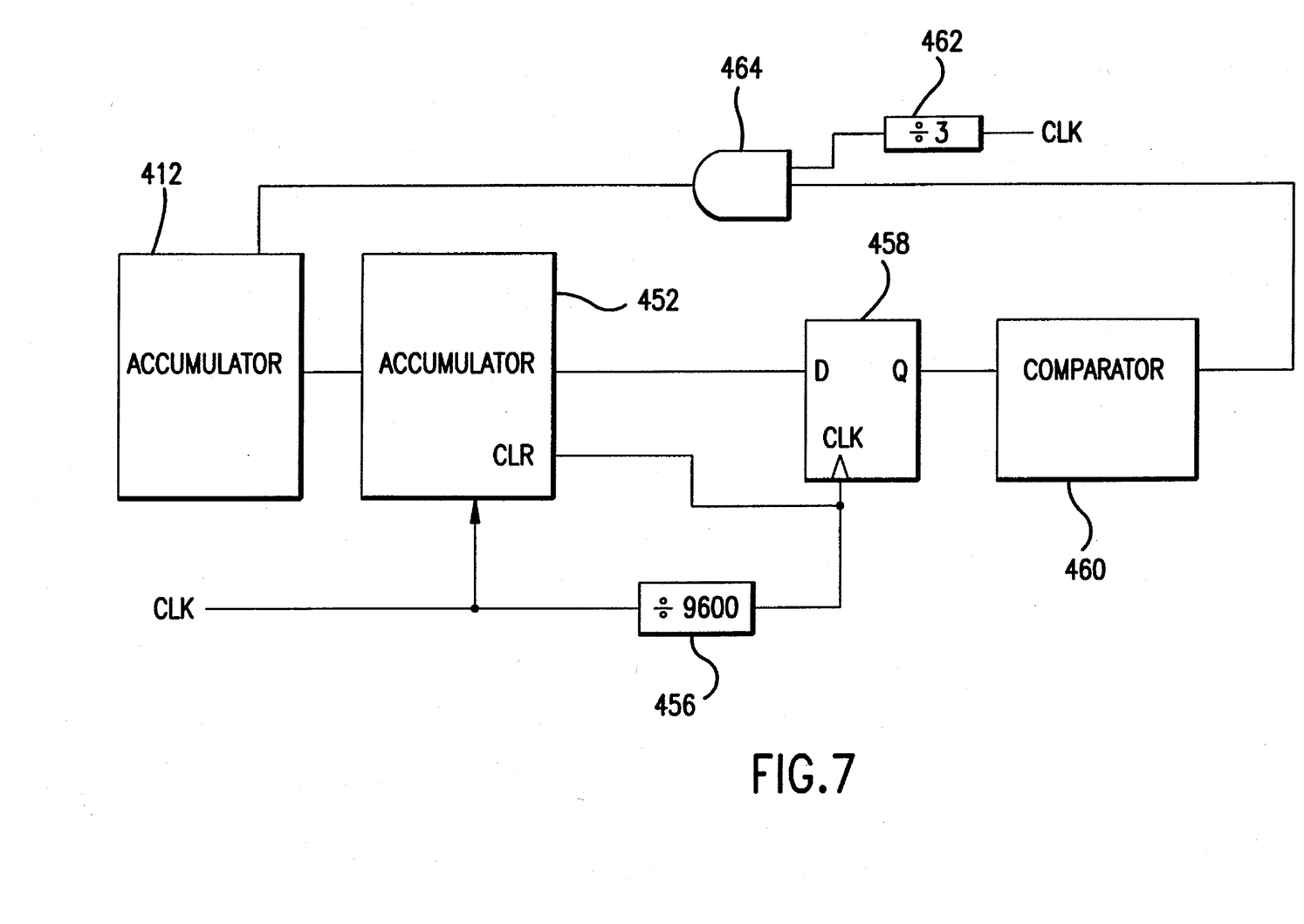
FIG. 7 is a schematic diagram of a DC Offset elimination circuit compatible with the delta modulator receiver of FIG. 6.

The circuitry of the delta modulator receiver may include DC offset reduction circuitry shown in FIG. 7. That DC offset reduction circuitry reduces the time period that DC offsets cause the value of the integrating accumulator 412 to exceed the full scale voltage of the digital to analog converter 414.

The circuitry of the DC offset reduction circuitry of FIG. 7 digitally performs a second integration on the count or current value in the integrating accumulator 412 at a subsonic rate (i.e., below thirty hertz). If that digital integration results in a value above a predetermined limit, the magnitude of the count value is decremented by one every third system clock cycle. The decrementing of the magnitude of the count value continues until during one of the integration periods, the magnitude of that sum is within the predetermined limit.

In particular in FIG. 7, a DC offset accumulator 452 is initially cleared during power on. For each system clock period, the DC offset accumulator 452 adds the current value in the integrating accumulator 412 for a twentieth of a second interval to obtain a DC offset sum. This period has been selected so that the frequency of any DC offset correction will be sub-sonic. The frequency of twenty hertz may be obtained by dividing the system clock in a divider 456 by nine thousand six hundred. Every one twentieth of a second, a data latch 458 latches the sum of the DC offset accumulator 452. That latched sum is then provided to a window comparator 460. The window comparator determines if the unsigned magnitude of the latched DC offset sum exceeds a predetermined value. If the magnitude of the DC offset sum stored in the data latch 458 exceeds a predetermined sum after a predetermined number of samples or time period, the DC offsets have caused the converter 410 to reach the maximum or minimum full scale value; hence the output signal may no longer track the input signal.

The comparison magnitude for the window comparator 460 is selected based upon the full scale value of the integrating accumulator 412 for the entire one twentieth of a second. In the case of a sixteen bit integrating accumulator 412, using a maximum signed value of $7F_{16}$ or $127_{10}$, the comparison magnitude should be nine thousand six hundred times that maximum value or $1,219,200_{10}$. To reduce the number of bits of the comparator 460 the data latch 458 and the DC offset accumulator 452, the DC offset accumulator need only add the signed four most significant bits of the value of the integrating accumulator 412. In that event, the magnitude for the window comparator 460 is seven times 9600 or 67,200.

If the output of the comparator indicates that the latched DC offset value is outside the window, the comparator causes the magnitude of the integrating accumulator 412 to be reduced by one every third clock cycle during the subsequent sampling interval of one twentieth of a second. A subtraction or addition signal is gated through a gate 464 once in every three system clock pulses. The gating may be controlled by a divided by three by a divider 462.

The subtraction signal is supplied if the latched DC offset sum is positive and exceeds the magnitude of the window comparator 460. The addition signal is supplied if the latched DC offset sum is negative and exceeds the magnitude of the window comparator 460. The addition signal causes the value in the integrating accumulator 412 to be incremented by one plus or minus the value from the shifter 410 and the subtraction signal causes the value in the accumulator to be decremented by one plus or minus the value from the shifter 410. This DC offset correction process of accumulating the value of the accumulator 412 and altering the magnitude of the accumulator 412 every third cycle repeats during each one-twentieth of a second sampling interval.

It has also been found that a digital signal processor such as a 2101 or 2105 available from Analog Devices of Norwood, Mass., may be used for implementing the above described circuitry in software. Such a processor has multiple scratchpad registers, an arithmetic logic unit, a shifter, and operates in response to a program stored in either an internal or external memory. The arithmetic logic unit, the shifter and the memory may be used in combination to perform the functions of the circuits of FIGS. 3 and 5.

Figure 8:
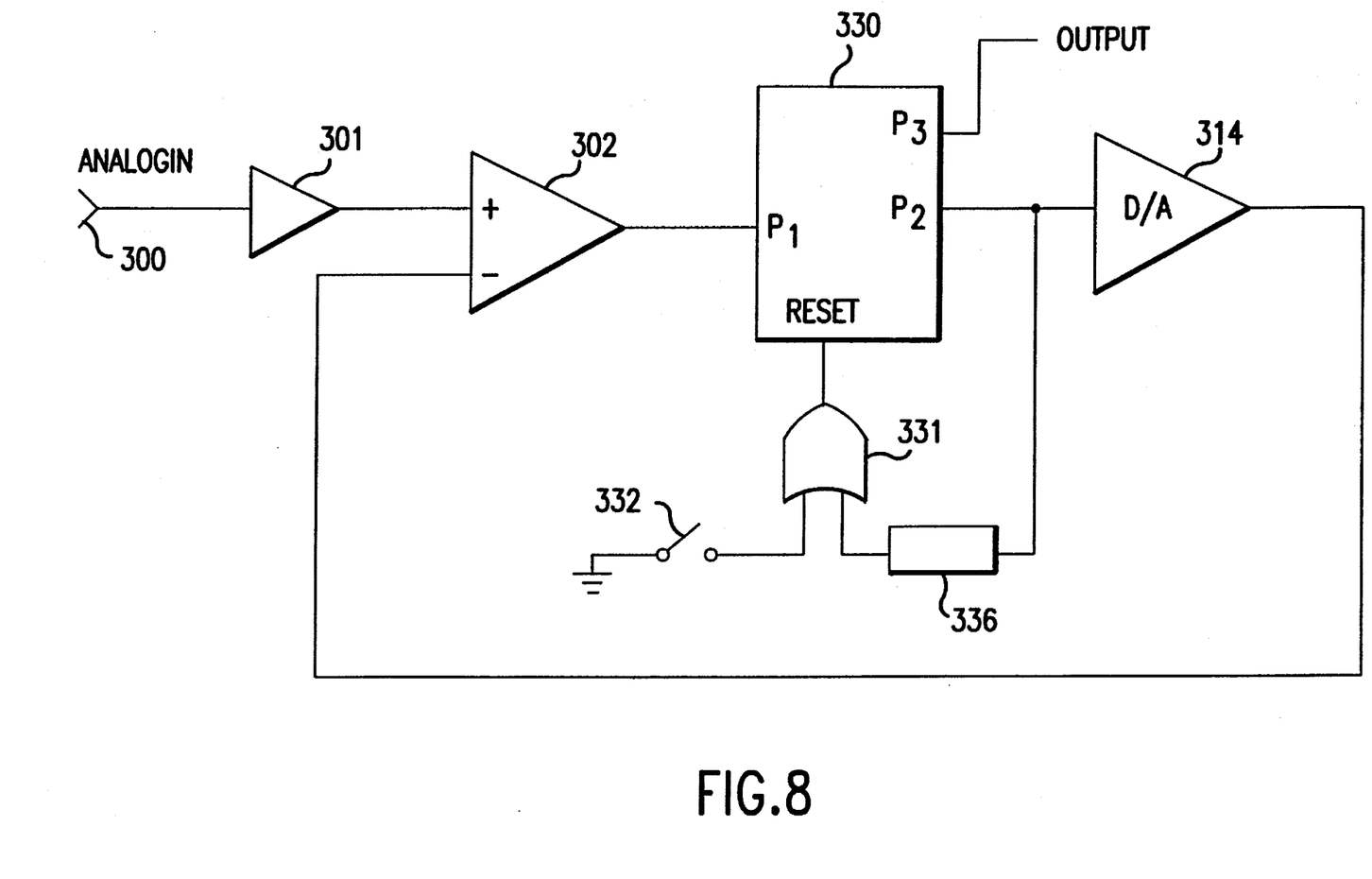
FIG. 8 is a schematic diagram of an alternative embodiment of the delta modulator of the present invention.

An example of such a circuit using such a digital signal processor is shown in FIG. 8. If a processor 330 lacks a digital to analog converter 314, a preemphasis amplifier 301 and a comparator 302, these external components may be supplied. In such a delta modulator, a port P1 of the digital signal processor is coupled to the output of the comparator and a port P2 is coupled to the input of the digital to analog converter. The processor clock frequency supplied to the digital signal processor must be high enough so that a new output to the digital to analog converter from the processor is supplied at least once every system clock period at a third port P3.

Table 1 below describes the operation of the software in pseudo-code format for the processor. For the purpose of clarity, however, it should be noted that initialization of the processor has been omitted. Of course, to completely replicate the circuit of FIG. 5, the processor must output a value to the digital to analog converter 314 (FIG. 8) once every 5.2 microseconds. t,200

In the above pseudo code, the block labelled Set Counter_Multiplier performs the function of the counter 309 and the shifter 310. The value Shift_Value corresponds to the output of the shifter 310 and the Accumulator value corresponds to the value stored in the integrating accumulator 312 of FIG. 5.

To avoid the processor in the transmitter locking up, the reset pin of the processor should be coupled to an OR gate 334. One input to the OR gate 334 is a push button switch 332 to permit external restarting of the transmitter processor. The other input to the OR gate should be coupled to a one millisecond "one-shot" 336 that fires if the output of the accumulator fails to change during that millisecond.

The receiver for the delta modulator may comprise of the same core of an Analog Devices 2101 or 2105 digital signal processor, and a converter 312 and uses essentially the same code described above. However, the receiver lacks a comparator 302 and a preemphasis amplifier 301. The digital output of the transmitter is coupled to a port P1 and the output of the processor for the accumulator value is coupled to a port P2 connected to the digital to analog converter 314. The output of the digital to analog converter is the output of the receiver. The one millisecond "one-shot" 336, the OR gate 334 and the switch 332 may also be included in the receiver to ensure against lock-up.

Alternatively by including a fourth serial port input P4 and a control signal input C on the microprocessor 330 to the embodiment of FIG. 8, that embodiment may be used as both a master and a slave processor. In other words, the embodiment of FIG. 8 serves as both a delta modulator and a delta demodulator. In response to a control signal C, the processor 330 toggles between code that causes the embodiment to be a delta modulator and another portion of code that causes the embodiment to be a delta demodulator. For example, in one state, the processor 330 creates a delta modulation output data stream at the serial port output P3 in response to an analog input signal at the input 300. In response to the control signal C, the processor 330 toggles states and becomes a delta demodulator providing an analog output at the output of the converter 314 in response to the serial delta modulation input data at the port P4.

Figure 9:
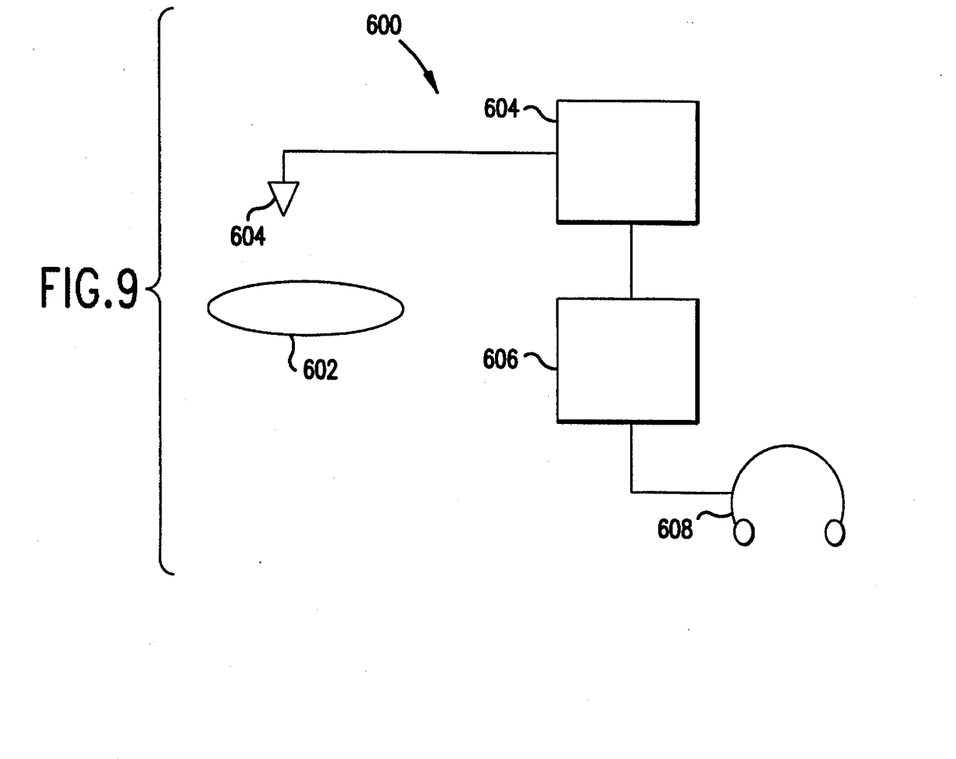
FIG. 9 is a block diagram of a radio communications system using the delta modulators of the type disclosed herein.

If the embodiment of FIG. 8 is used in a radio communication system shown in FIG. 9, the control signal C may be generated in response to a depress to talk switch on a transmitter (not shown). Alternatively, the control signal C may be generated in response to a voice detection circuit such as the Motorola MC2830 integrated circuit (not shown) detecting a voice signal to be transmitted. Activation of this control signal C causes the internal registers for the processor 330 to be cleared and set to the appropriate initial conditions so that the embodiment may toggle between being a demodulator and a modulator.

Still further alternate embodiments of the digital signal processor based delta modulator and demodulator of FIG. 8 are possible using memory lookup tables to speed up the operation of the processor. For example, the look up table of Table 2 may be used to replace the code portion under the heading Set Counter_Multiplier above in Table 1 with the pseudo code in Table 2. In this latter table, the left significant bit indicates the oldest sample and the right bit indicates the latest sample of the output of the comparator 302. Hence a three bit sequence comprised of the three most recent samples of the output of the comparator 302 controls the flow of the program for part of the arithmetic calculation. t,240

A still further efficiency in coding may be obtained by using a memory lookup table using the current sample bit and the three previous sampled bits to replace the lookup table of table 2. Again, the left-most bit is the oldest bit and the right bit is the most recent sample. Further, the instruction NOP means no operation. t,260

Using such a look-up table, only two of the sixteen possible sequences require more than one operation. Only if the input pattern is "1111" or "0000" must the processor perform an increment and a left shift to multiply in the Set_Count_Multiplier portion of the code. Otherwise, the counter is either decremented without any shifting or no operation is performed at all. Thus, the speed of a software based delta modulator may be greatly improved. Still further increases in speed may be possible from the use of bit sequences longer than four bits.

In addition, offsets may be readily reduced by implementing the DC offset circuitry of FIG. 7 as described above in software. Pseudo-code for replacing the Calc portion of the code of Table 1 is given below In Table 4: t,270

It should be noted that in this pseudo code, DC_Count is a thirty two bit word while all other words are sixteen bits.

An alternative formula is used for calculating the accumulator for every third calculation in this method if this DC offset reduction approach is used:

$$Accumulator_i = Accumulator_{i-1} \pm (Multiplier*Counter) + \alpha$$

where $\alpha=0$ if Add_Flag and Minus_Flag are low where $\alpha=+1$ if the Add_Flag is High where $\alpha=-1$ if the Minus_Flag is high By this method, offsets may be eliminated in the receiver. Still further, the memory look-up table in table 3 may be further modified to include the foregoing method for eliminating offsets. In that event, a fifth bit and a sixth bit are used for generating the lookup table. That fifth bit indicates that the DC offset has exceeded the maximum magnitude for the digital to analog converter. The sixth bit indicates whether the excessive magnitude is a positive or negative quantity.

By using the various techniques described in the above embodiments, several advantages are attained. Tests have demonstrated that the above method of transmission is much less sensitive to noise than standard PCM encoding. Further, unlike other delta modulators, DC offsets may readily be eliminated. +P One advantage of where the foregoing embodiments of the present invention are particularly useful is in voice communications in an extremely noisy communication channel. It is believed that human speech transmitted by the disclosed embodiments may be readily understood as measured against an articulation index even with bit error rates (BER) of over 0.01. Therefore, the disclosed invention is particularly useful for digitizing speech for transmission over noisy radio channels such as those found with mobile radio telephony such as cellular telephony and direct satellite broadcast. The disclosed methodology also results in voice transmission that is relatively insensitive to fading, multipath problems, and other communications problems caused by buildings and the environment for the communications channel.

An example of such a system is shown in FIG. 9. In FIG. 9, two transceivers 510a and 510b communicate over a noisy communications channel 512 such as a cellular channel in a cellular telephone system. In the transceiver 510a, an audio signal source such as a microphone (not shown) provides a voice signal to a signal processor 514 of the type shown in FIG. 8. Audio amplifiers (not shown) may precondition the voice signal before encoding by the signal processor of FIG. 8. The delta modulated data is then supplied as a serial delta modulated bit stream to a transmitter 516 for any form of digital modulation including AM, FM, PSK, PM and the like using dual sideband or single sideband with the carrier or with a suppressed carrier. The output of the transmitter 516 comprised of a carrier modulated with a serial delta modulation bit stream is then supplied to the antenna 518 for transmission over the air waves or through any other communications channel. The communication channel may also include one or more transponders including satellite transponders and repeaters.

The receiver antenna 520 receives the transmitted carrier modulated by the delta modulation data and the receiver 522 demodulates the transmitted data. The demodulated data is provided to a slave processor 524 of the type described above, The output of the slave processor 524 may then be amplified and converted into sound by a standard audio system (not shown). Of course, two way communication may also be accomplished.

Because the transmitted information is in the form of a serial bit stream where any one bit is bit is a delta modulation bit, the loss of any one delta modulation bit has only a minor impact on the reproducibility of the signal. Although loss of bits may create a DC offset, such DC offsets will be eliminated quickly through the DC offset reduction techniques described above. Thus, the applicant has found that using the delta modulator of the type disclosed herein for serial data transmission results in intelligible speech transmission even if a bit error occurs in one in every 100 bits transmitted; i.e. a bit error rate of 0.01, which is about two orders of magnitude better than conventional systems.

Figure 10:
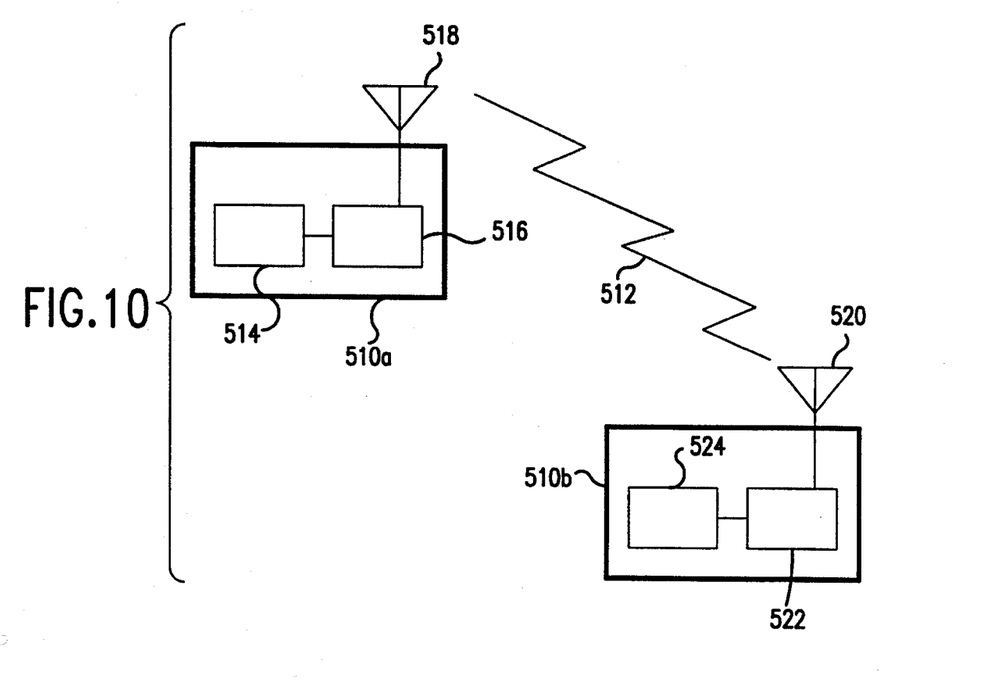
FIG. 10 is a block diagram of a mini-compact disc audio storage system using the delta modulators of the type disclosed herein.

In addition, the same techniques will also have advantages in electromechanical audio data storage and retrieval systems where the storage device may be moved such as in portable compact disc players. FIG. 10 depicts such a compact disk system 600. A mini-compact disk 602 rotates around a spindle (not shown) while a laser/optical sensor transducer 604 provides a serial delta modulator bit stream to a synchronizer. The output of the synchronizer 604 is coupled to a slave processor 606 such as the embodiment of FIG. 8. The analog output of the processor 606 may then be provided to an audio transducer 608 such as a pair of headphones. Even if the player receives a substantial mechanical shock causing the compact disk player to skip a track, no audible popping sound results. Further, if speech is recorded on the disk 602, the speech will remain intelligible even under frequent, severe mechanical shocks.

Hence, the enclosed embodiments of the delta modulator and demodulators have all of the advantages of prior art delta modulators without the drawbacks. DC offsets are quickly reduced, noise immunity is high and audio reproduction is good. Using a signal processor for the delta modulator and demodulator permits maximum flexibility in altering the system without any significant loss of speed and responsiveness of the system.

It will further be understood by those of ordinary skill in the art that many other alternative embodiments of the disclosed system can be built with double integration delta modulators, delta sigma modulators, or high information delta modulators. The scope of the invention is, of course, defined by the claims.

We claim:

1. A processor in one of a delta modulator and receiver in response to a serial bit stream representative of an analog signal, the processor comprising:

an arithmetic logic unit performing arithmetic and logic functions in response to a program;

a plurality of memory areas for storing data produced by the arithmetic logic during performance of the program;

a program memory storing a program for selecting the data to be used, and the arithmetic and logic functions to be performed, wherein one of the stored datum is a first quantity proportional to the analog signal, the program memory including a program for causing the arithmetic logic unit to generate a delta modulated serial bit stream and the program memory including the steps of incrementing or decrementing a value based upon the serial data stream;

selectively altering the data in response to a transition in the bit stream;

accumulating the selectively altered data to generate the first quantity; and providing the first quantity to the digital to analog converter; and a digital to analog converter coupled to receive the quantity.

2. The processor of claim 1, wherein the program memory further includes a memory look-up table such that in response to different data streams, different portions of the memory look-up table are used for selecting the functions to be performed by the arithmetic logic unit.

3. The processor of claim 1, further including:

a comparator receiving an analog input signal at a first input, and a signal proportional to the output of the digital to analog converter as the second input, the serial data stream being the output of the comparator.

4. The processor of claim 1, the program further including the steps of:

periodically sampling the first quantity and accumulating those samples for a predetermined interval;

determining if the magnitude of the accumulation of those periodic samples exceeds a predetermined magnitude; and decreasing from time to time the first magnitude of the first quantity during the subsequent interval.

5. The processor of claim 4, wherein the predetermined interval is longer than the period of an audible sound.

6. The processor of claim 4, wherein the frequency of decreasing the magnitude of the first quantity is one-third of the frequency of accumulating the selectively altered data.

7. The processor of claim 1, wherein the processor further includes a means for monitoring the output to the digital to analog processor and for resetting the processor to an initial state if no activity is detected at the output after a predetermined period of time.

8. A processing circuit responsive to delta modulation data, the improvement comprising:

an input pattern detector to detect different sequences of the delta modulation data;

a first bidirectional accumulator accumulating a quantity in different directions in response to that input pattern detector;

a transformer responsive to the pattern detector for selectively outputting an altered first quantity in response to only certain detected input patterns and otherwise outputting the first quantity;

a second bidirectional accumulator accumulating the output of the transformer; and a digital to analog converter responsive to the accumulated output of the transformer.

9. The processing circuit of claim 8 further including a comparator for comparing the output of the converter and an input analog signal, the output of the comparator providing the delta modulation data.

10. The processing circuit of claim 8 wherein the processing circuit includes:

an arithmetic logic unit and a plurality of memory means; and wherein each of the input pattern detector, the first accumulator, the transformer and the second accumulator each comprise at least one memory means and the arithmetic logic unit is used sequentially in combination with the separate memory means to detect the input pattern, accumulate the quantities and transform the quantity.

11. The processing circuit of claim 8, wherein the processing circuit further includes:

a third accumulator to accumulate the output of the second accumulator;

a comparator to determine if the magnitude of the third accumulator has exceeded a predetermined limit; and means responsive to the comparator for altering the magnitude of the second accumulator if the comparator indicates that the predetermined limit has been exceeded.

12. In a delta modulator for converting an analog signal into a digital output signal, the output of the modulator providing sequential samples of a comparison between the analog input signal and an integration of the output signal, wherein the integration occurs in response to a controlled signal, the improvement comprising:

an accumulator that accumulates a count;

means for controlling the magnitude of the controlled signal in differing proportions to the count; and means for increasing the count in response to the absence of a change in the output and to otherwise decreasing the count to a minimum, the means for increasing and decreasing the count comprises means for increasing the count in response to a first predetermined sequence and for decreasing the magnitude of the controllable signal in response to a different sequence.

13. A delta modulator/demodulator processor for selectively receiving an analog input signal and a digital input delta modulated signal and producing in response to the analog input signal an output digital delta modulated bit stream and producing an analog output signal in response to the digital input signal, the processor comprising:

a control means for selecting whether the processor will delta modulate the analog input signal or demodulate the digital input data, wherein the control means includes a voice detector and selects between modulating and demodulating based upon the output of that detector;

a feedback signal generator providing a feedback signal as an analog output when delta demodulation is selected;

a comparator that compares the analog input signal to the feedback signal; and a sampler responsive to the comparator that provides the digital output signal in response to the delta demodulator when delta modulation is selected.

14. The processor of claim 13, wherein the control means is responsive to a push to talk switch.

15. The processor of claim 13, wherein the control means includes a voice detector and selects between modulating and demodulating based upon the output of that detector.

16. A processor for providing an output delta modulation representation of an analog input signal and an analog output representation of an input delta modulation signal, the delta processor comprising:

an arithmetic logic unit performing arithmetic and logic functions in response to a program;

a plurality of memory areas for storing data produced by the arithmetic logic unit during performance of the program; a program memory storing a program for selecting the data to be used, and the arithmetic and logic functions to be performed, wherein one of the stored datum is a first parameter proportional to the analog input signal and a second stored datum comprising an accumulation based upon the delta modulation signal a digital to analog converter responsive to one of the first and second stored datum, the analog output of the processor being the output of the converter;

a comparator responsive to the analog input signal and the output of the converter, wherein the digital output of the processor comprises a sampling of the comparator output by the processor and wherein the processor has a control input, the processor providing the analog output only in response to a first condition at the control input and providing the digital output only in response to a second condition at the input.

17. In a delta modulator receiver susceptible to DC offsets and for transforming a delta modulated data stream into an analog output signal, the delta modulator comprising:

an alterable accumulator accumulating a parameter based upon the sampled output and an offset signal;

a feedback signal generator generating the feedback signal based upon the accumulated output; and a filter responsive to the accumulator to generate the offset signal to thereby remove DC offsets and wherein the receiver includes an arithmetic processing unit and alterable memory and wherein the accumulator includes a memory within a processor holding the accumulated parameter and the filter includes a second memory location holding a second accumulated parameter.

18. A method for processing delta modulation data, the improvement comprising:

detecting different sequences of the delta modulation data;

accumulating a quantity in different directions in response to that input pattern detector;

providing as a second quantity either a transformed first quantity in response to only certain detected input patterns and otherwise a quantity equal to the first quantity;

accumulating the second quantity; and converting the accumulated second quantity into an analog voltage having a magnitude that is proportional to the accumulated quantity.

19. The method of claim 18, wherein the method further comprises:

comparing the analog voltage with an input signal, and providing the delta modulation data based upon the comparison.

20. The method of claim 18, wherein the method further comprises:

accumulating the accumulated second quantity to provide a third quantity;

determining if the third quantity exceeds a predetermined limit; and altering the magnitude of the second accumulated quantity if the predetermined limit has been exceeded.

* * * * *